Figure 1:
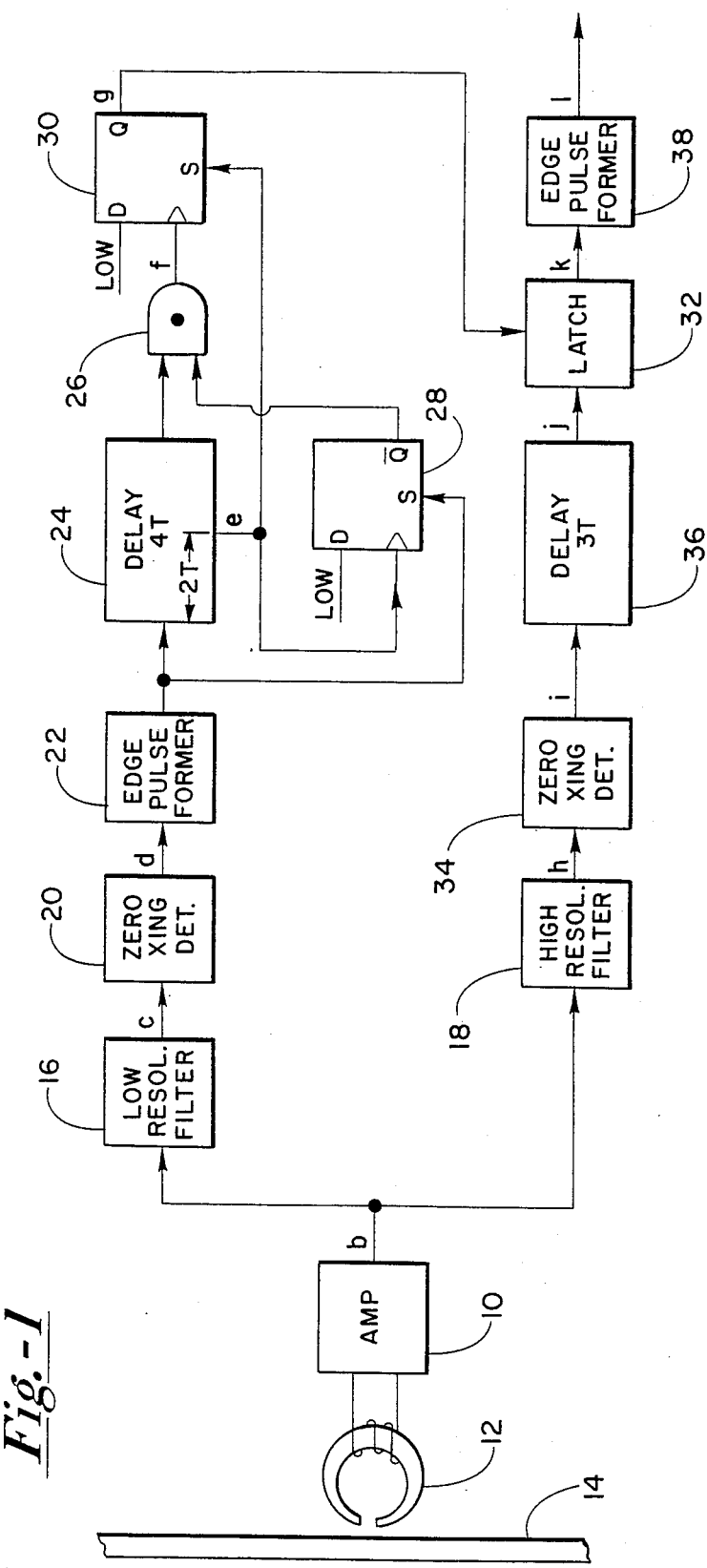

United States Patent [19]

Minuhin et al.

[11] Patent Number: 4,813,059

[45] Date of Patent: Mar. 14, 1989

[54] READBACK RECOVERY OF RUN LENGTH LIMITED CODES

[75] Inventors: Vadim B. Minuhin; Vernon F. VonDeylen, both of Bloomington, Minn.

[73] Assignee: Magnetic Peripherals Inc., Minneapolis, Minn.

[21] Appl. No.: 182,264

[22] Filed: Apr. 15, 1988

[51] Int. Cl.[4] .............................................. H04B 1/66
[52] U.S. Cl. ..................................... 375/122; 360/24; 360/36.1
[58] Field of Search .................. 375/25, 96, 104, 122; 360/22, 24, 46, 36.1, 39, 51, 68; 381/34; 358/261, 261.1, 261.2, 261.3, 262

[56] References Cited

U.S. PATENT DOCUMENTS

| | | | |
|---|---|---|---|
| 3,953,802 | 4/1976 | Morris et al. | 375/104 |
| 3,988,679 | 10/1976 | Clarke et al. | 375/104 |
| 4,291,344 | 9/1981 | Kimura | 360/361 |
| 4,337,458 | 6/1982 | Cohn et al. | 360/40 |
| 4,517,610 | 5/1985 | Minuhin | 360/39 |
| 4,697,098 | 9/1987 | Cloke | 375/104 |
| 4,706,265 | 11/1987 | Furukawa | 375/122 |

*Primary Examiner*—Robert L. Griffin
*Assistant Examiner*—Stephen Chin
*Attorney, Agent, or Firm*—Robert M. Angus; Joseph A. Genovese

[57] ABSTRACT

Run length limited codes, such as (1,7) codes are recovered with a dual channel recovery system in which the high resolution channel normally supplies the output (recovered) signal. The low resolution channel includes a detector, such as a delay device and gate, to detect a predetermined absence of transitions in the low resolution signal (which is indicative of long strings of successive zeros) to inhibit the high resolution channel from supplying the output. The result is to effectively block the high resolution channel from providing a false output.

14 Claims, 2 Drawing Sheets

READBACK RECOVERY OF RUN LENGTH LIMITED CODES

This invention relates to data recovery systems, and particularly to the recovery of run length limited codes.

In U.S. Pat. No. 4,517,610 by V. B. Minuhin for "Multi-Channel Signal Recovery Circuit" granted May 14, 1985, there is described a dual channel read recovery system in which a high resolution channel and a low resolution channel recover recorded signals. The high resolution signal processed by the high resolution channel is characterized by its accurate recovery of pulses representative of digital information, but also by the high likelihood of inclusion of spurious pulses which are not representative of digital information. The spurious pulses may, for example, be created by noise. On the other hand, the low resolution channel processes a low resolution signal which is characterized by the absence of spurious pulses, but are also by relative inaccurate location of pulses representative of data. As described in the aforementioned U.S. Pat. No. 4,517,610, recorded signals to be recovered are processed in parallel through the high and low resolution channels with the results of each channel being logically processed to remove the inaccuracies of the pulse position caused by the low resolution channel and to remove the spurious signals in the high resolution channel. The result is a highly accurate recovery of information pulses.

In MFM codes, also known as (1,3) codes, there is a minimum of one binary zero and a maximum of three binary zeros between consecutive binary ones. In (2,7) codes, there is a minimum of two binary zeros and a maximum of seven binary zeros between successive binary ones. Since recording transitions occur only for binary ones, it can be shown that the ratio of high to low recording frequencies of MFM codes is of the order of 2:1, that is, the recording frequency for minimal number of zeros between consecutive ones is twice the recording frequency for the maximum number of zeros between consecutive ones. In (2,7) codes, the ratio of high to low frequencies is of the order of 2.67:1

(1,7) run length limited codes have gained significant popularity due to the advantage of a large detection window, which is a critical parameter in readback recovery systems. See U.S. Pat. No. 4,337,458 granted June 29, 1982, to M. Cohn et al. See also U.S. patent application No. 116,989 filed Nov. 5, 1987 by V. B. Minuhin, assigned to the same assignee as the present application. (1,7) codes are characterized by having a minimum of one binary zero and a maximum of seven binary zeros between consecutive ones. One disadvantage, however, of (1,7) codes is the fact that the ratio of high to low frequencies is of the order of 4:1, which ratio is significantly higher than MFM or (2,7) codes.

One problem of implementing the dual channel recovery system described in the aforementioned U.S. Pat. No. 4,517,610 to recovery of (1,7) codes is that the low resolution filter must exhibit a quite low resolution at frequencies where successive recording transitions are separated by seven quiescent clock periods corresponding to seven zeros in the code pattern. The low resolution is required to keep its output removed from the zero line. Further, the low resolution filter must have a high enough resolution to deliver all the true zero crossings for code patterns with just one zero between successive ones. In addition, the resolution must be done with acceptable levels of inter-symbol interference and signal to noise ratio. For high density recording, the contradiction of high and low resolution requirements for the low resolution filter cannot be satisfactorily resolved for (1,7) codes.

It is an object of the present invention to provide a technique for recovery of run length limited codes, including run length limited codes having long intervals between successive transitions.

It is another object of the present invention to provide a method and apparatus for recovery of (1,7) codes, wherein the low resolution filter may be designed with less resolution.

In accordance with the present invention, the high resolution channel is operated during periods of relatively few successive zeros (absences of transitions) to recover data. The low resolution channel includes detector apparatus for detecting a predetermined number of successive zeros (wherein no transitions occur). The detector operates a latch in the high resolution channel. When the low resolution channel detects the predetermined number of successive zeros, the latch in the high resolution channel is disabled, thereby preventing recovery of false pulses. When the low resolution channel again detects a transition (indicating a binary one), the latch in the high resolution channel is operated to permit recovery of the one by the accurate high resolution channel.

One feature of the present invention resides in the selection of delays in both the high and low resolution channel to be certain that a transition in the low resolution channel sets the latch in the high resolution channel prior to a time that the same transition would trigger an output from the high resolution channel.

Another feature of the present invention resides in the fact that data recovery is accomplished from the high resolution channel, except that the high resolution chnnel is inhibited for intervals of absences of transitions (long zero strings).

Figure 2:
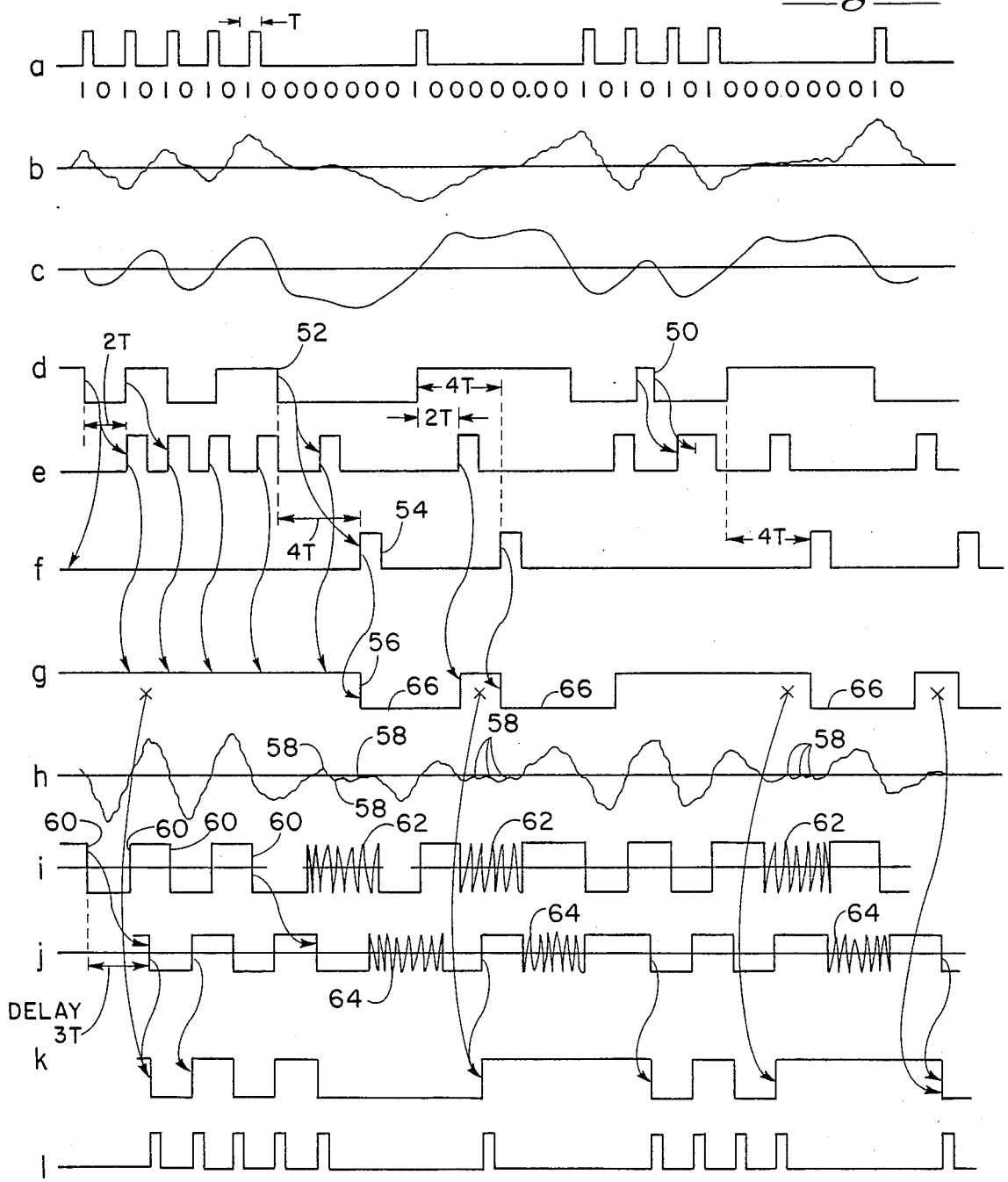

Another feature of the present invention resides in the fact that the low resolution filter may be designed for the lower, and a detector detects the absence of transitions (successive zeros) in excess of a design limit to inhibit the high resolution channel from providing an output based on spurious signals The above and other features of this invention will be more fully understood from the following detailed description, and the accompanying drawings, in which:

FIG. 1 is a block circuit diagram of a dual channel read recovery system in accordance with the presently preferred embodiment of the present invention; and FIG. 2 are waveforms at various points in the circuit of FIG. 1 useful in explaining the operation of the apparatus shown in FIG. 1.

Referring to the drawings, and particularly to FIG. 1, there is illustrated a dual channel read recovery system in accordance with the presently preferred embodiment of the present invention. The system includes an amplifier 10 having an input from transducer 12 (which may be a magnetic read head) which reads magnetic signals recorded on media 14. Amplifier 10 responds to transitions in the recorded signal to provide an output (shown at waveform b in FIG. 2) to both the low resolution filter 16 and high resolution filter 18. The low resolution filter 16 is designed for frequencies at the low end of the frequency range of the (1,7) code employed. Low resolution filter 16 provides an output, waveform c in FIG. 2, to zero crossing detector 20, which in turn provides an output, waveform d in FIG. 2, to edge pulse former 22. Edge pulse former 22 provides an output to delay circuit 24. Delay circuit 24 will delay the signal received from pulse former 22 by a total of 4 clock periods and provide an input to AND gate 26. Delay circuit 24 is also center tapped to provide a delayed signal, waveform e in FIG. 2, which is delayed two clock cycles from the input from edge pulse former 22. The waveform e in FIG. 2 is supplied to the overriding set input of D-type flip-flop 28, whose D input is tied to a source of low voltage. The Q-not output of flip-flop 28 is provided to a second input of AND gate 26. AND gate 26 provides a signal output, shown as waveform f in FIG. 2, to the clock input of D-type flip-flop 30. D-type flip-flop 30 has its D input connected to a source of low voltage. The set input of flip-flop 30 is connected to receive the waveform e shown in FIG. 2. The Q output of flip-flop 30, shown at waveform g in FIG. 2, is provided to latch 32.

In the high resolution channel, the output of the high resolution filter 18 is shown at waveform h in FIG. 2, and is provided to zero crossing detector 34, which in turn provides an output, shown at waveform i in FIG. 2, to delay 36. Delay 36 will delay the signal shown at waveform i by three clock cycles, as shown at waveform j in FIG. 2. Latch 32 responds to the signals shown at waveforms g and j in FIG. 2 to provide an output shown at waveform k in FIG. 2 to edge pulse former 38, which in turn provides an output, shown at waveform l. Latch 32 is conditioned by a high input of waveform g to respond to the edges of pulses of waveform j to provide the waveform k output.

With reference to FIG. 2, the operation of the apparatus shown in FIG. 1 may be explained. Waveform a in FIG. 2 is a representation of a string of binary digits and pulses representative of each of the binary ones therein. Each pulse is shown as having a positive going edge at the center of a clock period T. The particular binary pattern illustrated at waveform a illustrates both the high frequency (minimum number of zeros) and low frequencies (maximum number of zeros) of a (1,7) code. Thus, the waveform a comprises the binary bits 1010101010000000100000001010101000000010. Waveform b illustrates the signal provided by amplifier 10 which will vary between positive and negative peaks in an analog fashion. Low resolution filter 16 responds to waveform b to provide a signal shown at waveform c crudely converting peaks of waveform b to zero crossings. However, the zero crossings of waveform c are not perfectly aligned with the peaks of waveform b which designate the centers of the transitions of waveform a. Thus, the low resolution channel is not accurately tracking the signal. Also noteworthy, waveform c displays an absence of spurious signals caused by noise and the like. Zero crossing detector 20 responds to the zero crossing of waveform c to provide waveform d, which is provided to edge pulse former 22, which responds with short pulses for each edge of waveform d. Pulse former 22 provides the pulse signal to the overriding set input of flip-flop 28 to disable AND gate 26. Delay 24 provides a first delay signal to the clock input of flip-flop 28. The first delayed signal, shown at waveform e, is an exact copy of the output of edge pulse former 22, except that it is time delayed by two clock cycles. Thus, the successive edges of waveform d provide separate pulses in waveform e. Note, however, that because of the spacings, the trailing edge of pulse 50 in waveform d does not create a new pulse in waveform e. Thus, instead of four pulses for the four ones shown in waveform a at the corresponding location, only three pulses are generated by pulse former 22.

Delay circuit 24 operates two clock cycles (2T) following the output of edge pulse former 22 to set the Q output of flip-flop 30 high to provide a high waveform g output. At the same time, the pulse on waveform e toggles flip-flop 28 to force the Q-not output of flip-flop 28 high, thereby providing an enabling input to AND gate 26. However, in the event another pulse from pulse edge former 22 is received by the overriding set input of flip-flop 28, the Q-not output of flip-flop 28 is forced low to remove the enabling input to AND gate 26. However, if no input pulse operates to set flip-flop 28, the Q-not output of flip-flop 28 remains high until a delay of an additional two clock cycles occurs (2T) and a second delayed signal output occurs directly from delay circuit 24 to AND gate 26. With both inputs of AND gate 26 now high, AND gate 26 provides a pulse shown at waveform f in FIG. 2 to the clock input of flip-flop 30 to toggle the Q-output of flip-flop low, as shown at waveform g.

It is evident, therefore, that the AND gate 26 will not be operated to provide a pulse of waveform f unless there have been four clock cycles of successive zeros. Hence, edge 52 of waveform d formed the pulse 54 of waveform f, thereby forcing waveform g low as shown at edge 56.

The signal of waveform b from amplifier 10 is also provided to high resolution filter 18, which is shown at waveform h in FIG. 2. The signal of waveform b is characterized in that the peaks are accurately positions in zero crossovers of waveform h, but is also characterized in that the signal contains spurious signals, caused by noise and the like. The spurious signals form additional crossovers and peaks, such as at 58 in waveform h. The signal of waveform h is provided to zero crossing detector 34 which provides a pulse edge for each zero crossing of the signal of waveform h. Thus, the signal of waveform i is characterized by having pulse edges at the zero crossings of waveform h matching the binary ones shown in waveform a, and also by having additional zero crossings 62 formed by the spurious signals 58 in waveform h. Delay circuit 36 delays the signal of waveform i by a period of time which is less than the total period of time of the delay of delay circuit 24. For the present purposes, we prefer that the delay of delay circuit 36 delays signal i by three clock cycles to form the signal of waveform j.

The signal of waveform j is provided as an input to latch circuit 32. Latch 32 is responsive to the pulse edges of the signal of waveform j to provide identical pulse edges in the output waveform k, when the enable signal of waveform g is high When the enable signal of waveform g is low, as at 66 in waveform g, latch 32 will not respond to pulse edges in waveform j. As a result, since the low level of waveform g occurs only during periods of lengthy successive zeros when spurious signals are likely to occur in the high resolution channel, the low levels of waveform g act to mask out the spurious signal 64 of waveform j, resulting in waveform k. Pulse edge former 38 responds to the edges of the pulses of signal waveform k to form the signal of waveform l to reproduce the binary signal of waveform a.

The present invention thus provides a readback recovery system in which long strings of absence of transitions are detected by one of the channel to effectively disable the other channel from responding to and detecting spurious signals. As a result, the low resolution channel may be designed to respond to lower frequencies of the frequency range of the data signal.

Although the present invention described in connection with detecting strings of four or more zeros (absences of transitions), the circuit can, of course, be adjusted to respond to any number of zeros as desired, merely by adjusting the lengths of the delays 24 and 36. We prefer that the delay of delay circuit 36 be somewhat shorter, such as one clock cycle shorter, than the full delay of delay circuit 24. In this respect it is important that both channels be delayed so that the detection circuits bring the two channels into reasonable synchronism for operation in latch circuit 32. However, for (1,7) codes the spurious signals will typically occupy no more than about four clock cycles, usually commencing during the third cycle of consecutive zeros and ending during the sixth cycle of consecutive zeros, in the case of seven consecutive zeros. Therefore, it is important that the signal g be low for at least about five clock cycles during these periods. By using the delays herein suggested, the appropriate signal resolution is achieved, even with and inaccuracies of data recovery reflected in the waveform b. Due to the three clock cycle delay in the high resolution channel formed by delay circuit 36, the spurious signal 64 usually will not appear until about five clock cycles (in absolute time) following a transition 60 in waveform i or transition 52 in waveform d. Since the waveform g goes low about five absolute clock cycles following such transition, the spurious signals are effectively blanked out by disabling the high resolution channel during these periods. Thus, recovery of signals is possible, even of signals with long periods of no transitions, such as in (1,7) codes.

This invention is not to be limited by the embodiment shown in the drawing and described in the description, which is given by way of example and not of limitation, but only in accordance with the scope of the appended claims.

What is claimed is:

1. Apparatus for recovering digital information in a run length limited code comprising:
   high resolution recovery means for receiving a read signal and producing a high resolution pulse signal representative of digital information contained in the read signal;
   output means responsive to said high resolution pulse signal for providing an output pulse signal representative of the digital information in said read signal;
   low resolution recovery means for receiving said read signal and producing a low resolution pulse signal representative of digital information contained in the read signal;
   detection means responsive to a predetermined interval of absence of transitions in said low resolution pulse signal; and
   disable means responsive to said detection means for disabling said output means.

2. Apparatus according to claim 1 wherein said detection means comprises delay means responsive to said low resolution recovery means for providing a delayed low resolution pulse signal, and gate means responsive to the delayed and the undelayed low resolution pulse signal to provide a disable signal upon said predetermined interval of absence of pulses in said low resolution signal.

3. Apparatus according to claim 2 wherein said delay means comprises a first delay circuit for delaying said low resolution pulse signal for a first period of time corresponding to said predetermined interval and a second delay circuit for delaying said low resolution pulse signal for a second period of time less than said first period of time, and said gate means includes latch means responsive to said second delay circuit and to the undelayed low resolution pulse signal for producing a latch signal.

4. Apparatus according to claim 3 wherein said gate means further includes an AND gate responsive to said latch means and to said first delay circuit for producing a gate signal, and enable means responsive to said AND gate for producing a disable signal and responsive to a low resolution pulse signal from said low resolution recovery means for producing an enable signal.

5. Apparatus according to claim 4 wherein said disable means comprises second latch means responsive to said enable signal for providing said high resolution pulse signal to said output means and responsive to said disable signal for inhibiting said high resolution pulse signal from being provided to said output means.

6. Apparatus according to claim 5 further including second delay means for delaying said high resolution pulse signal.

7. Apparatus according to claim 2 wherein said gate means includes enable means responsive to said low resolution pulse signal to provide an enable signal and responsive to said delayed low resolution pulse signal to provide a disable signal.

8. Apparatus according to claim 7 wherein said disable means comprises second latch means responsive to said enable signal for providing said high resolution pulse signal to said output means and responsive to said disable signal for inhibiting said high resolution pulse signal from being provided to said output means.

9. Apparatus according to claim 8 further including second delay means for delaying said high resolution pulse signal.

10. Apparatus according to claim 2 wherein said disable means comprises second latch means responsive to said detection means for inhibiting said high resolution pulse signal from being provided to said output means.

11. Apparatus according to claim 10 further including second delay means for delaying said high resolution pulse signal.

12. The method of recovering digital information in a run length limited code comprising the steps of:
    producing a high resolution pulse signal representative of said digital information;
    recovering digital information from said high resolution signal;
    producing a low resolution pulse signal representative of digital information;
    detecting a predetermined interval of absence of transitions in said low resolution pulse signal; and
    disabling the recovery of digital information from the high resolution pulse signal during intervals corresponding to a detected predetermined interval.

13. The method according to claim 12 wherein detecting a predetermined interval of absence of pulses in said low resolution pulse signal is performed by delaying said low resolution pulse signal by a predetermined interval and determining from the delayed and undelayed low resolution pulse signal whether pulses occurred in the low resolution pulse signal during the predetermined interval.

14. The method according to claim 13 further including delaying the high resolution pulse signal by a second predetermined interval less than the first-mentioned predetermined interval.

* * * * *